(12) United States Patent
Anthony et al.

(10) Patent No.: US 6,649,423 B2
(45) Date of Patent: Nov. 18, 2003

(54) METHOD FOR MODIFYING SWITCHING FIELD CHARACTERISTICS OF MAGNETIC TUNNEL JUNCTIONS

(75) Inventors: Thomas Anthony, Sunnyvale, CA (US); Lung Tran, Saratoga, CA (US); Manish Sharma, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/971,347

(22) Filed: Oct. 4, 2001

(65) Prior Publication Data

US 2003/0067802 A1 Apr. 10, 2003

(51) Int. Cl.$^7$ ................... H01L 21/00; H01L 21/8038
(52) U.S. Cl. ................... 438/3; 438/131; 438/210

(58) Field of Search ................ 438/3, 166, 171, 438/210, 131; 365/171, 173, 210, 266, 688

(56) References Cited

U.S. PATENT DOCUMENTS

| | | | | |
|---|---|---|---|---|
| 5,650,958 A | * | 7/1997 | Gallagher et al. | 365/173 |
| 5,841,692 A | * | 11/1998 | Gallagher et al. | 365/173 |
| 5,982,660 A | | 11/1999 | Bhattacharyya et al. | |
| 6,048,739 A | * | 4/2000 | Hurst et al. | 438/3 |
| 6,326,637 B1 | * | 12/2001 | Parkin et al. | 257/9 |
| 6,430,085 B1 | * | 8/2002 | Rizzo | 365/173 |
| 2002/0003685 A1 | * | 1/2002 | Takahashi et al. | 360/327.3 |
| 2002/0081786 A1 | * | 6/2002 | Toet et al. | 438/166 |

* cited by examiner

Primary Examiner—Michael S. Lebentritt

(57) ABSTRACT

A magnetic tunnel junction is fabricated by forming pinned and sense layers; and re-setting a magnetization vector of at least one of the layers.

24 Claims, 7 Drawing Sheets

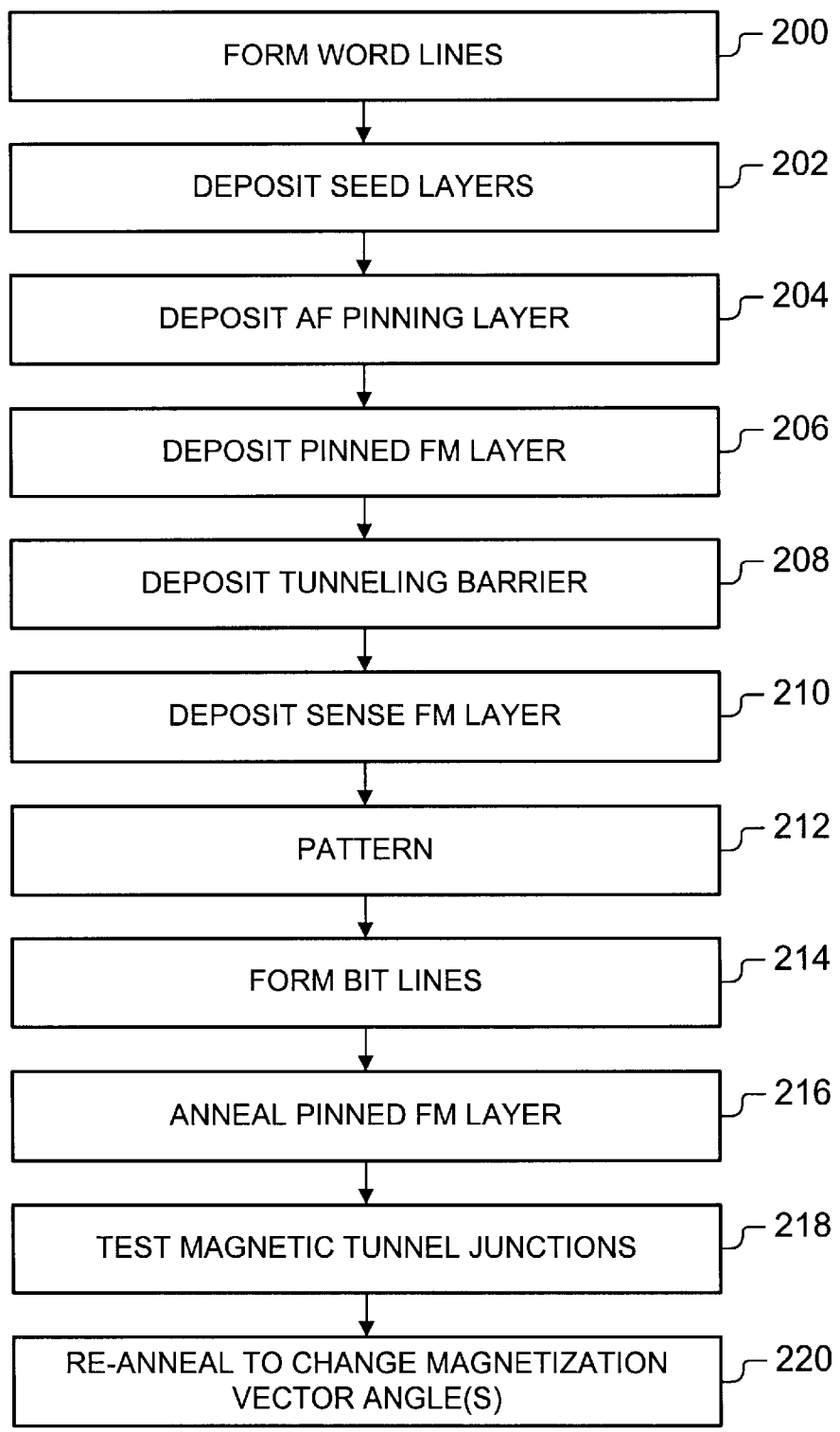

METHOD FOR MODIFYING SWITCHING FIELD CHARACTERISTICS OF MAGNETIC TUNNEL JUNCTIONS

BACKGROUND

The present invention relates to information storage devices. More specifically, the present invention relates to memory devices including magnetic tunnel junctions.

A typical Magnetic Random Access Memory ("MRAM") device includes an array of memory cells, word lines extending along rows of the memory cells, and bit lines extending along columns of the memory cells. Each memory cell is located at a cross point of a word line and a bit line.

The MRAM memory cells may be based on magnetic tunnel junctions ("MTJs") such as spin dependent tunneling ("SDT") junctions. A typical SDT junction includes a pinned layer, a sense layer and an insulating tunnel barrier sandwiched between the pinned and sense layers. The pinned layer has a magnetization vector that is fixed so as not to rotate in the presence of an applied magnetic field in a range of interest. The sense layer has a magnetization vector that can be oriented in either of two directions: the same direction as the pinned layer magnetization vector or an opposite direction of the pinned layer magnetization vector. If the magnetization vectors of the pinned and sense layers are in the same direction, the orientation of the SDT junction is said to be "parallel." If the magnetization vectors of the pinned and sense layers are in opposite directions, the orientation of the SDT junction is said to be "anti-parallel."

These two stable orientations, parallel and anti-parallel, represent logic values of '0' and '1.' The magnetization orientation, in turn, affects the resistance of the SDT junction. Resistance of the SDT junction is a first value if the magnetization orientation is parallel and a second value if the magnetization orientation is anti-parallel. The magnetization orientation of the SDT junction and, therefore, its logic value may be read by sensing its resistance state.

The memory cell array may be fabricated by depositing a stack of magnetic memory element layers, and patterning the stack into memory elements. Ideally size, shape and thickness of the memory elements are uniform.

In practice, however, the thickness, size and shape are not uniform. Variations in size, shape, and layer thickness result in variations in the magnetic properties of the memory elements in the MRAM array. In particular, the variations of these parameters can occur from wafer-to-wafer, but they can also occur from die-to-die and array-to-array. These variations can reduce the integrity of writing of data and may also have the undesired side effect of unselected bit erasure. As the memory elements are reduced in size, these variations and their undesired effects become more prominent, especially with respect to switching coercivity of the sense layers.

Yet it is a goal of memory manufacturers to reduce the size of the memory elements. Reducing the size increases storage density, which, in turn, reduces storage cost. Reducing the size also reduces power consumption, which is advantageous for mobile products.

SUMMARY

According to one aspect of the present invention, a magnetic tunnel junction is fabricated by forming pinned and sense layers; and re-setting a magnetization vector of at least one of the layers. Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 3 is an illustration of a method of fabricating an SDT junction.

DETAILED DESCRIPTION

Figure 1:
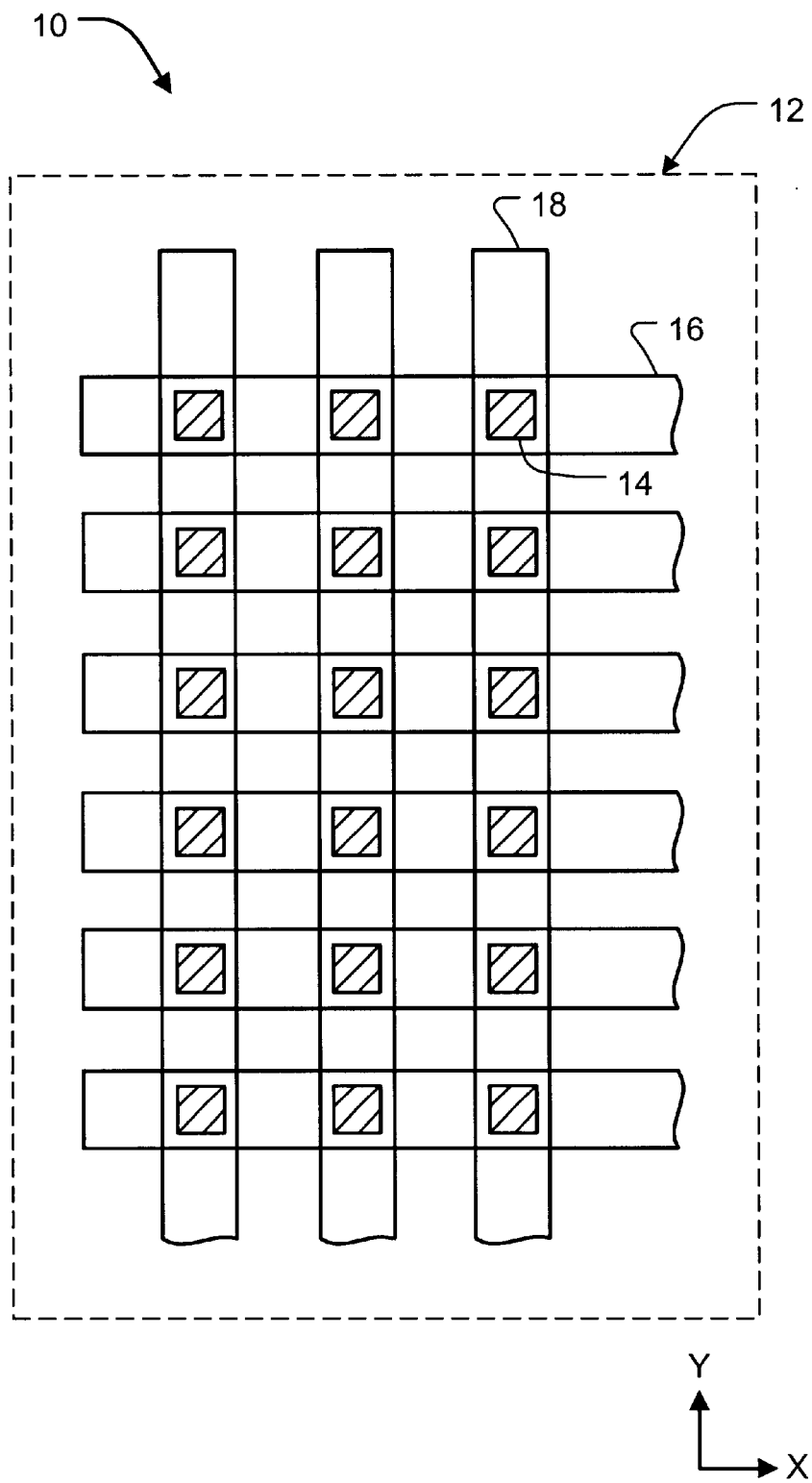
FIG. 1 is an illustration of an MRAM device including an array of SDT junctions.

Reference is now made to FIG. 1, which illustrates an MRAM device 10 including a resistive cross point array 12 of SDT junctions 14. The SDT junctions 14 are arranged in rows and columns, with the rows extending along an x-direction and the columns extending along a y-direction. Only a relatively small number of the SDT junctions 14 is shown to simplify the illustration of the MRAM device 10. In practice, arrays of any size may be used.

Traces functioning as word lines 16 extend along the x-direction in a plane on one side of the array 12. Traces functioning as bit lines 18 extend along the y-direction in a plane on an adjacent side of the array 12. There may be one word line 16 for each row of the array 12 and one bit line 18 for each column of the array 12. Each SDT junction 14 is located at a cross point of a word line 16 and a bit line 18. The MRAM device 10 includes a read/write circuit (not shown) for sensing the resistance states of selected SDT junctions 14 during read operations and for supplying write currents to selected word and bit lines 16 and 18 during write operations.

Figure 2:
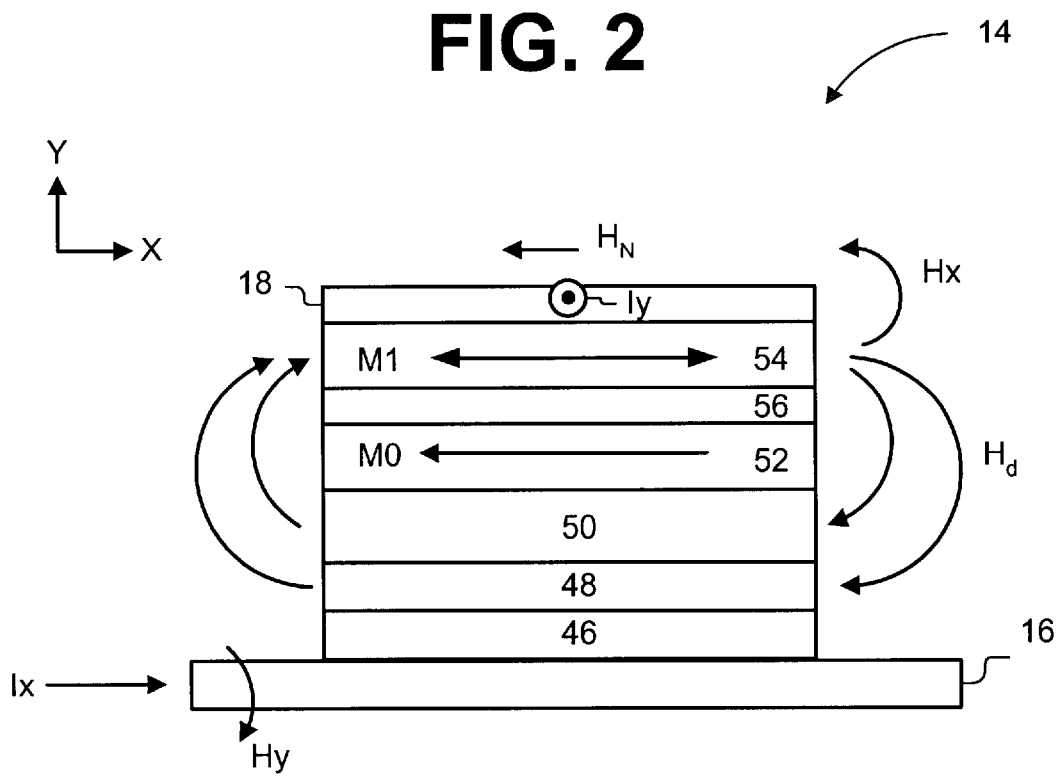
FIG. 2 is an illustration of the basic structure of an SDT junction.

Reference is made to FIG. 2, which shows an SDT junction 14 in greater detail. The SDT junction 14 includes a pinned ferromagnetic (FM) layer 52, an insulating tunnel barrier 56 on the pinned FM layer 52, and a sense FM layer 54 on the tunnel barrier 56. The pinned FM layer 52 has a magnetization vector M0 that is oriented in the plane of the pinned layer 52. The pinned FM layer 52 may be made of a ferromagnetic material such as NiFe, iron oxide ($Fe_3O_4$), chromium oxide ($CrO_2$), cobalt, or cobalt alloys (e.g., CoFe, NiFeCo).

The magnetization vector M0 of the pinned layer 52 may be pinned by a structure including first and second seed layers 46 and 48, and an AF pinning layer 50. The first seed layer 46 allows the second layer 48 to be grown with a (111) crystal structure orientation, and the second seed layer 48 establishes a (111) crystal structure orientation for the AF pinning layer 50. The AF pinning layer 50 provides a large exchange field, which holds the magnetization vector M0 of the pinned FM layer 52 in one direction, even in the presence of an applied magnetic field in a range of interest. This makes the pinned FM layer 54 a "hard" FM layer, which does not rotate easily. The first seed layer 46 may be made of titanium (Ti) or tantalum (Ta), and the second seed layer 48 may be made of nickel-iron (NiFe) or NiFeCo. Other seed layer materials include Ru, TaN, TiN, $Al_2O_3$, and $SiO_2$. The AF pinning layer 50 may be made of a synthetic ferromagnetic material (e.g., CoFe/Ru/CoFe multi-layers) or an antiferromagnetic material (e.g., IrMn, FeMn, PtMn).

The sense layer 54 has a magnetization vector M1 that is not pinned. Instead, the sense layer magnetization vector M1 can be oriented in either of two directions in the presence of an applied magnetic field in a range of interest. This makes the sense layer 54 a "soft" FM layer. The magnetization orientation of the SDT junction 14 is parallel when the sense layer magnetization vector M1 is oriented in the same direction as the pinned layer magnetization vector M0, and it is anti-parallel when the sense layer magnetization vector M1 is oriented in the opposite direction of the pinned layer magnetization vector M0. Sense FM layer materials include, but are not limited to NiFe, NiFeCo and CoFe.

The insulating tunnel barrier 56 allows quantum mechanical tunneling to occur between the pinned and sense layers 52 and 54. This tunneling phenomenon is electron spin dependent, making the resistance of the SDT junction 14 a function of the relative orientations of the magnetization of the pinned and sense layers 52 and 54. For instance, resistance of the SDT junction 10 is a first value (R) if the magnetization orientation of the SDT junction 14 is parallel and a second value (R+ΔR) if the magnetization orientation is anti-parallel. The insulating tunnel barrier 56 may be made of aluminum oxide ($Al_2O_3$), silicon dioxide ($SiO_2$), tantalum oxide ($Ta_2O_5$) or silicon nitride ($SiN_4$). Other dielectrics and certain semiconductor materials may be used for the insulating tunnel barrier 56.

Magnetic fields (Hx, Hy) may be applied to the SDT junction 14 by supplying currents (Iy, Ix) to the word and bit lines 16 and 18 contacting the SDT junction 14. If the word and bit lines 16 and 18 are orthogonal, the applied magnetic fields (Hx, Hy) will also be orthogonal.

Neel "orange-peel" coupling ($H_N$), also referred to as FM coupling, is believed to be caused by interface roughness between the pinned and sense layers 52 and 54. Magnitude of the FM coupling is:

$$H_N = \frac{\pi^2 h^2}{\sqrt{2}\lambda t_F} M_S e^{-2\pi\sqrt{2}\, t_S/\lambda}$$

where h and λ are the amplitude and wavelength of the interface roughness, $M_s$ is the saturation magnetization of the sense layer 54. The terms $t_F$ and $t_S$ are thickness of the sense layer 54 and the insulating tunnel barrier 56, respectively.

Magnetostatic coupling ($H_d$), also referred to as antiferromagnetic (AF) coupling, is believed to be caused by uncompensated magnetic poles at edges of the pinned layer 52 and the second seed layer 48. The average AF coupling is:

$$H_M = A \frac{W^\alpha}{L}$$

where W and L are the junction width and length, A is a constant, and α is a dependence of the dimensions of the SDT junction 14. The value of α should approach 1 where the separation between the pinned and sense layers 52 and 54 is much greater than their width. The value of α should approach 0 where the separation between the pinned and sense layers 52 and 54 is much less than their width.

The FM coupling remains constant across the area of the SDT junction 14, and it is independent of the size of the SDT junction 14. In contrast, the AF coupling is highly non-uniform across the area of the SDT junction 14 and within the volume of the SDT junction 14. The AF coupling is also dependent on junction size and shape: it becomes significantly stronger as the junction dimensions approach sub-micron.

The FM coupling tends to align the magnetization vector M1 of the sense layer 54 in a parallel orientation with the magnetization vector M0 of the pinned layer 52. The AF coupling tends to force the magnetization vector M1 of the sense layer 54 away from the magnetization vector M0 of the pinned layer 52. Consequently, during fabrication, the sense layer magnetization vector M1 will align along an orientation that is a net result of FM coupling and the AF coupling. The crystal anisotropy and magnetostriction of the sense layer 54 also will affect the orientation and rotation of the sense layer magnetization vector M1.

Reference is now made to FIG. 3, which shows a method of fabricating an SDT junction 14. Word lines are formed on a wafer (200), and first and second seed layers are deposited on the word lines (202). An AF pinning layer is deposited on the second seed layer (204), and a pinned FM layer is deposited on the AF pinning layer (206). The FM layers are usually deposited in the presence of an applied magnetic field to establish a uniaxial magnetic anisotropy.

An insulating tunnel barrier is deposited atop the pinned FM layer (208). Optional interfacial layers may sandwich the insulating tunnel barrier.

Figure 4A:
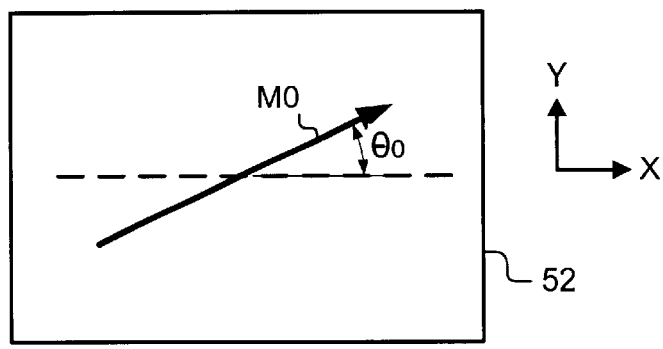
FIGS. 4a, 4b and 4c are illustrations of exemplary sense layer magnetization vectors of the SDT junction.
Figure 4B:
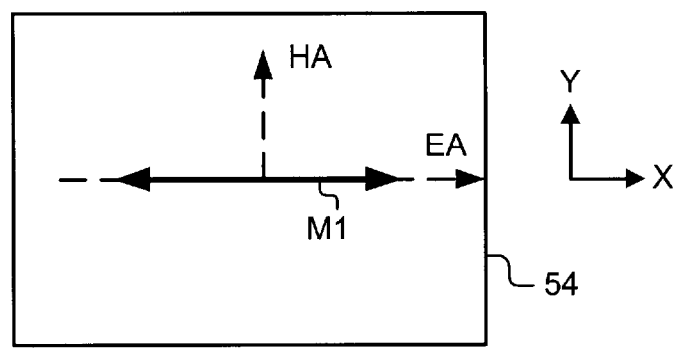

A sense FM layer is deposited atop the insulating tunnel barrier (210), the layers are patterned into an array of SDT junctions (212), and bit lines are formed on the SDT junctions (214). Hard and easy axes of the sense layer 54 are denoted by HA and EA, respectively. At this stage of fabrication, the sense layer magnetization vector M1 is aligned with the easy axis EA, which is aligned with the x-axis of the sense layer 54 (see FIG. 4b). The angle ($\theta_1$) of the sense layer magnetization vector M1 is $\theta_1=0$ degrees. Moreover, the angles ($\theta_0$ and $\theta_1$) of the pinned and sense layer magnetization vectors M0 and M1 are not necessarily the same. In particular, the magnetization of the pinned layer 52 may have been altered by exposure to relatively high temperatures during bit patterning.

The pinned FM layer is post-annealed at this point (block 216). The pinned FM layer is heated above its blocking temperature ($T_B$) and a desired angle ($\theta_0$) of the pinned layer magnetization vector M0 with respect to the x-axis of the pinned layer 52 (see FIG. 4a) is set by applying a magnetic field over a period of time. For example, the magnetization vector angle ($\theta_0$) of the pinned layer 52 may be set by applying a strong magnetic field of 2000 Oersteds in a direction parallel to the desired angle ($\theta_0$) of the magnetization vector M0 and heating the SDT junction to a temperature of 180° C.–300° C. for 15 minutes to several hours, depending upon the material. The SDT junction is then cooled in the presence of this magnetic field to fix the pinned layer magnetization at the desired angle ($\theta_0$). Magnetic exchange coupling between the AF layer and the pinned layer keeps the magnetization vector M0 pinned.

The SDT junctions are tested to determine whether AF coupling is greater than FM coupling, or vice versa (218). This can be done be measuring switching characteristics of the SDT junctions. Material defects and variations in size and shape can cause different SDT junctions to have different switching curves. Testing may be performed on many junctions to obtain statistical means for post-annealing at appropriate magnetization vector angles ($\theta_0$ and $\theta_1$).

Figure 4C:
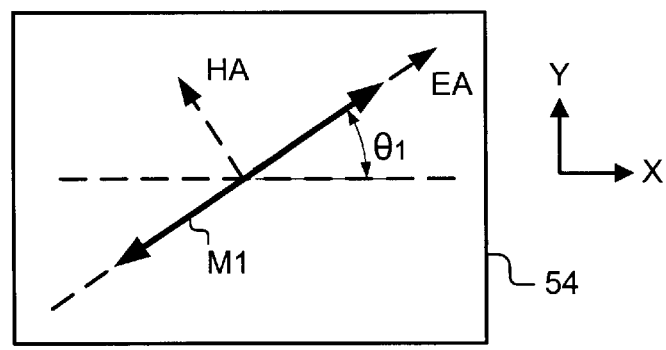

A change is made to the sense layer magnetization vector angle only, the pinned layer magnetization vector angle only, or both the sense layer and the pinned layer magnetization vector angles (220). The magnetization angle of the sense layer only may be changed as follows. The sense layer is heated above a threshold temperature for easy axis rotation (but below the blocking temperature of the pinned layer), and a magnetic field at a desirable angle to the easy axis is applied. The re-annealing does not change the magnetization angle of the pinned FM layer, but it does re-set the sense layer easy axis along the external applied field. For example, the magnetization angle of a NiFe sense FM layer may be changed by annealing the SDT junction at a temperature of 180–250° C. for 15–30 minutes, while applying an external magnetic field of 1000 Oersteds. The actual temperatures, duration and magnetic fields are material-dependent and layer-structure dependent. As a result, the sense layer magnetization angle ($\theta_1$) is changed to a new angle, as shown in FIG. 4c.

The magnetization vector angle ($\theta_0$) of the pinned layer only may be changed as follows. The SDT junction is annealed at or above the blocking temperature of the pinned layer material. The temperature will usually range from 200–280° C., depending upon the material. During heating and cooling stages of the annealing, the SDT junction is exposed to a magnetic field that sets the direction of the magnetization vector. The magnetization vector of the sense layer will also be set in the same direction as the magnetization vector of the pinned layer. Therefore, a subsequent lower temperature annealing step is performed to restore the magnetization vector of the sense layer.

Figure 5A:
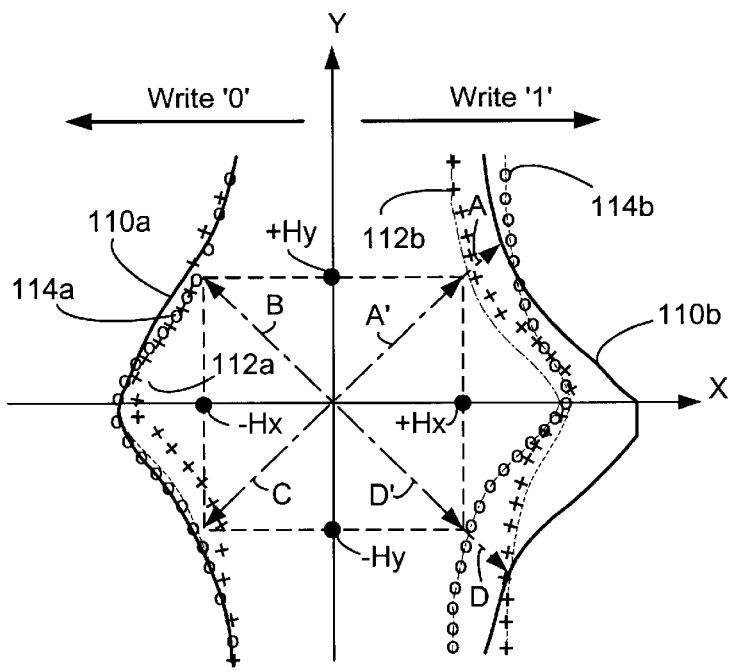
FIGS. 5a, 5b and 5c are illustrations of different SDT junction switching curves.

Reference is now made to FIG. 5a, which shows first, second and third pairs of SDT junction switching curves 110a and 110b, 112a and 112b, and 114a and 114b with respect to the x and y axes. In this particular example, the AF coupling is small relative to the ferromagnetic coupling (FM) since the data was collected from a large device. The first pair of switching curves 110a and 110b can result prior to annealing if the pinned and the sense layer magnetization vectors (M0 and M1) are both pointing along the x-axis, whereby the angle between sense and pinned layer magnetization vectors (M0 and M1) is either 0 degrees or 180 degrees (as shown in FIG. 6aa).

To switch from a low resistance state to high resistance state, the combined fields +Hx and +Hy (or –Hy) are applied to the junction. The +Hy or –Hy field causes the sense layer magnetization vector (M1) to move away from its easy axis EA, but the FM coupling field from the pinned layer will try to pull the sense layer magnetization vector (M1) to align with the pinned layer magnetization vector (M0) such that the angle separation between the vectors (M0 and M1) changes only gradually. Due to low torque angle between the sense layer magnetization vector (M1) and the +Hx field, a higher magnitude of +Hx field is needed for the SDT junction to switch states (as shown by curve 110b). On the other hand, to switch from high resistance state to low resistance state, the FM coupling field assists the –Hx field such that a smaller –Hx is needed (as shown by curve 110a). Thus, a higher combined field is needed to write a logic '1' than a logic '0' (as illustrated by the relative magnitudes of vectors A, B, C, and D).

Figure 6A:
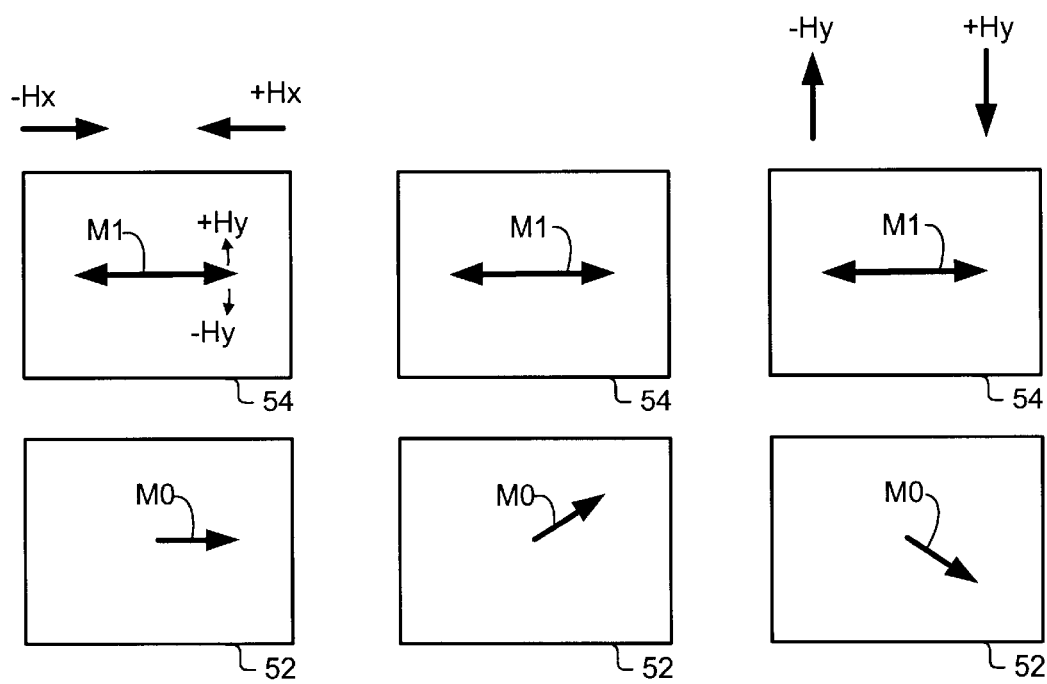
FIGS. 6aa, 6ab, 6ac, 6b and 6c are illustrations of other exemplary sense layer magnetization vectors of the SDT junction.

The impact of the FM coupling can be reduced by re-annealing the junction to set the pinned layer magnetization vector (M0) at an angle (e.g., $\theta_0$=+20 degrees) from the x-axis (see FIG. 6ab). The orientation of the sense layer magnetization vector (M1) is not changed. As a result, when a +Hy field is applied, the sense layer magnetization vector (M1) is pushed further away from the pinned magnetization. The result is the upper right part of the curve 112b. The lower right part of the curve 112b is the result of the –Hy field, which pushes the sense layer magnetization vector M1 toward the pinned layer magnetization vector M0. Thus the FM coupling is stronger and it becomes more resistant to rotation. The left hand side of the curve 112a does not change as much. Since the two magnetization vectors are substantially anti-parallel to one another, the FM coupling has less influence on the rotation of the sense layer 54.

Symmetry for the upper half of the switching curves 112a and 112b allows for the operation of the SDT junction. A +Hy magnetic field may be used in combination with a +Hx magnetic field to produce a magnetic field vector A' that switches the SDT junction from logic '0' to logic '1'. Similarly, a +Hy magnetic field may be used in combination with a –Hx magnetic field to produce a magnetic held vector B that switches the SDT junction from a logic '1' to a logic '0'. Because of this symmetry, the vectors A' and B are about the same magnitude, and they are both smaller in magnitude than vector A. Thus, the annealing helps to reduce the magnitude of the write field and, therefore, the current needed to produce the write field.

A similar curve 114 results if the opposite angle (e.g., $\theta_0$=–20 degrees) is re-set (see FIG. 6ac). The lower half of the curve 114 is symmetric along the y-axis. The SDT junction is made to operate in the lower half of the switching curve. An –Hy magnetic field may be applied in combination with a +Hx magnetic field to produce a vector D' that switches the SDT junction from a logic '0' to a logic '1'. Similarly, a –Hx magnetic field may be applied in combination with a –Hy magnetic field to produce a vector C that switches the SDT junction from a logic '1' to a logic '0'. Again, because of the symmetry obtained by annealing the pinned layer at an angle, the vectors D' and C are about the same magnitude, and they are both smaller in magnitude than vector D.

Figure 5B:
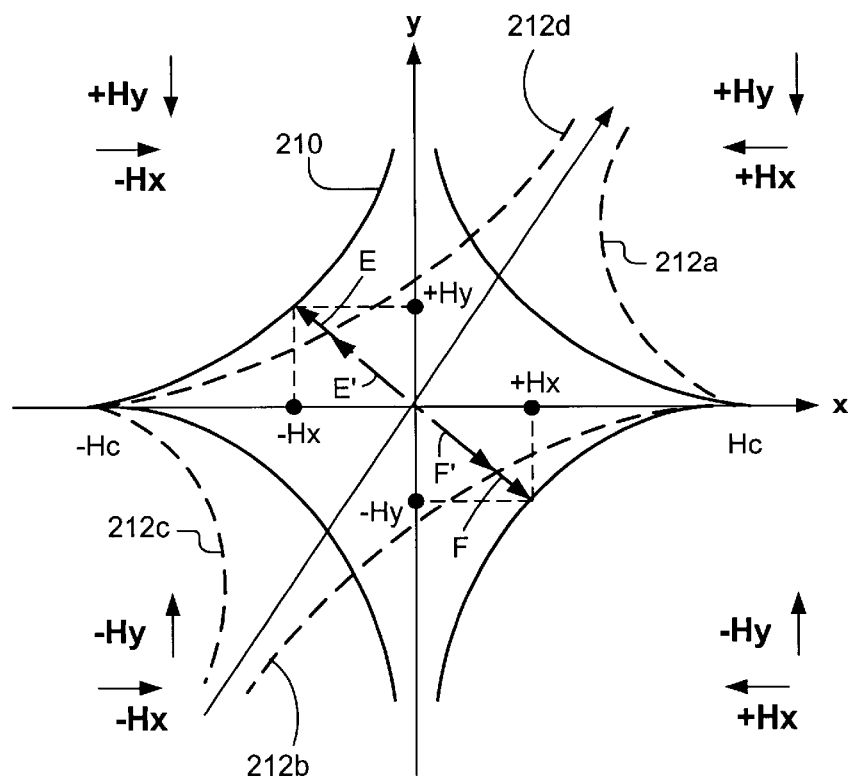

Reference is now made to FIG. 5b, which shows first and second SDT junction switching curves 210 and 212a/b/c/d with respect to the x end y axes. In this particular example, the junction size is one micron or less. Therefore, the AF coupling field Is substantial, and the coercivity Hc of the sense layer also increases substantially. The switching curve 210 results because the junction is annealed to align the easy axis EA and sense layer magnetization vector M1 along the x-axis. A large magnitude of Hx end Hy magnetic fields are needed to write logic '1' and a logic '0'. The combined magnetic fields Hx and Hy are represented by vectors E end F.

Figure 6B:
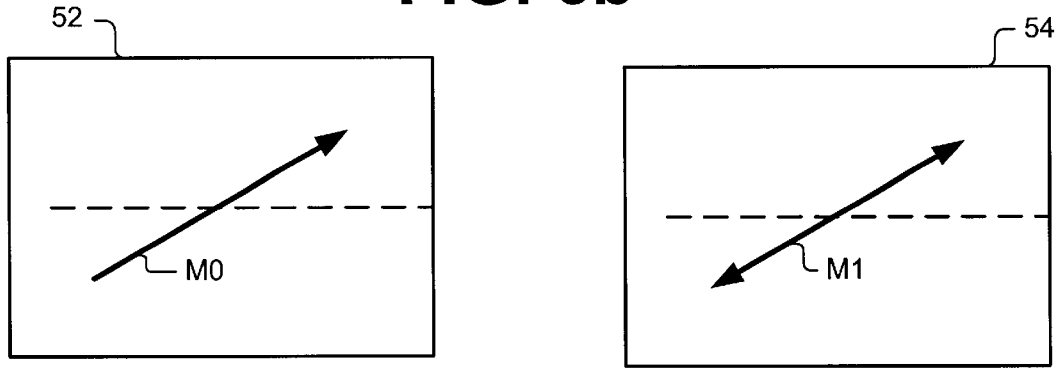

The impact of the AF coupling can be reduced by re-annealing the SDT junction such that both pinned and sense layer magnetization vectors are at the same angle (e.g., $\theta_0=\theta_1$=+20 degrees) relative to x-axis. The pinned layer magnetization vector M0 is fixed at an angle; the sense layer magnetization vector (M1) could be substantially parallel or anti-parallel with the pinned layer magnetization vector (M0) as shown in FIG. 6b. The FM coupling field and the AF coupling field are also pointing along this new EA and they are opposing one another. The switching curve 212 has four segments 212a, 212b, 212c and 212d, each corresponding to a quadrant on the x and y-axes. The segment 212a is in the first quadrant that has +Hy pushing the sense layer magnetization vector (M1) toward the x-axis, thus becoming more aligned with the +Hx field. This makes the switching of the sense layer magnetization vector (M1) from parallel to anti-parallel less sensitive to the applied +Hx field due to low torque effect. The segment 212b in the fourth quadrant corresponds to switching the sense layer magnetization vector (M1) from parallel to anti-parallel state when the −Hy and +Hx fields are applied to the SDT junction. In this case the −Hy field is pushing the sense layer magnetization vector (M1) further away from the horizontal x-axis; thus the torque angle is larger for greater magnitude −Hy, and the sense layer magnetization vector (M1) is more sensitive to the +Hx magnetic field.

Similar results occur with the segments of the switching curve 212c and 212d in the third and second quadrant of the x-y axes. The +Hy magnetic field pushes the sense layer magnetization vector (M1) further away from x-axis, and the −Hx magnetic field flips the sense layer magnetization vector from anti-parallel to parallel. Thus switching of the sense layer magnetization vector (M1) is sensitive to the −Hx magnetic field. On the other hand, the −Hy magnetic field pushes the sense layer magnetization vector (M1) towards the x-axis, and the −Hx magnetic field flips the sense layer magnetization vector (M1) from anti-parallel to parallel. As a result, switching of the sense layer magnetization vector (M1) is less sensitive to the −Hx magnetic field. As a result, there is good symmetry between the curves 212a/212c and 212b/212d with respect to the center of x-y coordinate. Vectors E' and F' represent the combined critical magnetic field for switching the SDT junction from anti-parallel to parallel (that is, for writing a logic '0') and from parallel to anti-parallel (that is, for writing a logic '1'). The magnitude of the vectors E' and F' are smaller than the magnitudes of vectors E and F. Thus, lower write currents are needed to switch the SDT junction.

Figure 5C:
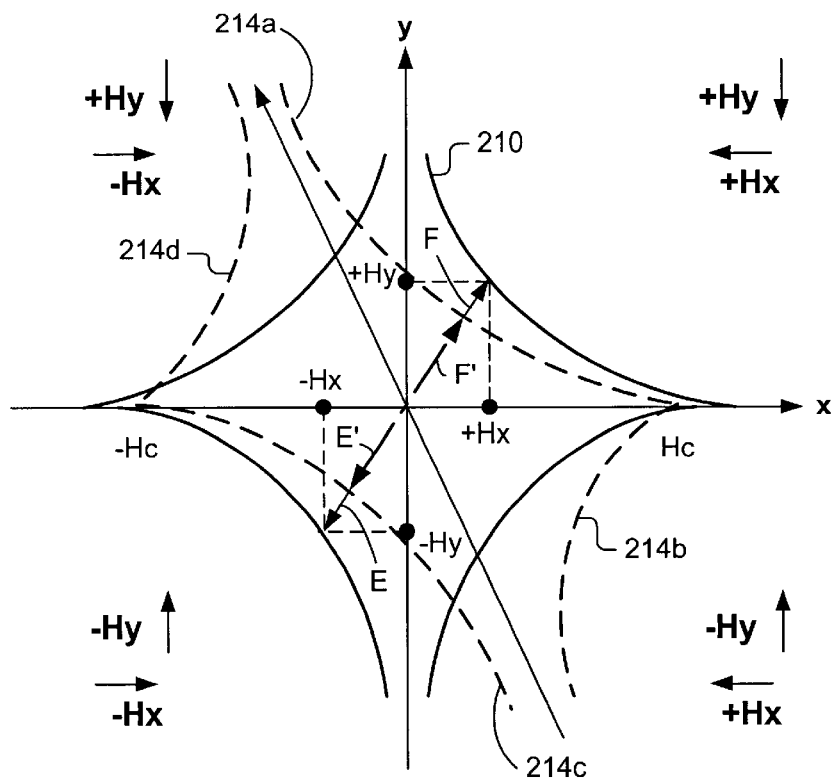
Figure 6C:
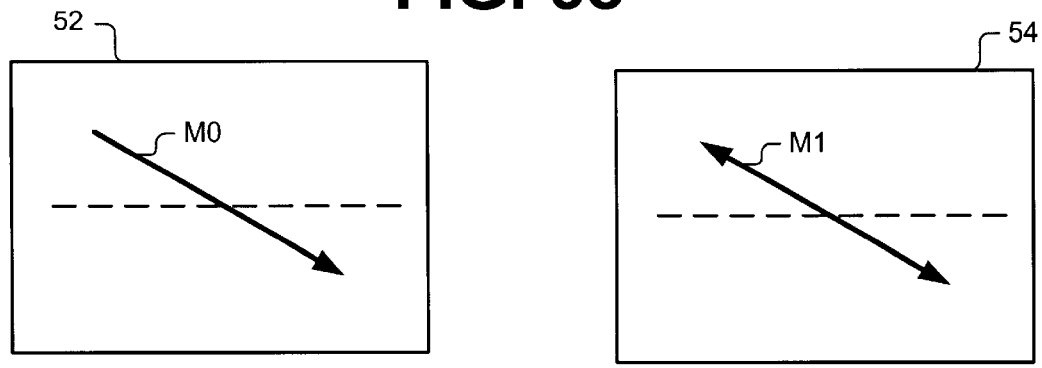

Reference is now made to FIG. 5c, which shows the four segments 214a, 214b, 214c and 214d of the switching curve when a negative angle (e.g., θ0=θ1=−20 degrees) is set during the annealing (see also FIG. 6c). The four segments 214a, 214b, 214c and 214d appear to be a mirror of the four segments 212a, 212b, 212c and 212d shown in FIG. 5b.

If the SDT junctions are fabricated on a wafer, the angles of an array of SDT junctions may be changed simultaneously. The re-setting of the magnetization vector angles reduces variations in properties of the junctions across the wafer, especially for SDT junctions having the same size and shape. Thus better process control is achieved during manufacture.

Different angles may be set during re-annealing. The angles will depend upon the desired switching characteristics. This flexibility enables the memory manufacturers to compensate for the manufacturing variations.

Furthermore, critical switching fields are reduced and become more symmetric. Improving the symmetry of the switching fields reduces the complexity of the control circuitry and improves half-select margin. Reducing the switching fields reduces power consumption, which is important for portable devices.

Re-setting the magnetization vector angles improves write performance and reduces the error rate due to half-select. Thus the MRAM device operates more reliably, has a better yield, and has a lower cost.

The MRAM device according to the present invention may be used in a wide variety of applications. For example, it may replace DRAM, SDRAM, flash, and other fast, short-term memory in computers. It may be used for long-term data storage in a computer. Such a device offers many advantages (e.g., faster speed, smaller size) over hard drives and other conventional long-term data storage devices. The MRAM device according to the present invention may be used in digital cameras for long-term storage of digital images.

The SDT junctions are not limited to a square or rectangular geometry. For example, the SDT junctions could have an elliptical geometry.

The MRAM device is not limited to SDT junctions. Other types of magnetic tunnel junctions, such as colossal magneto-resistive (CMR) and giant magneto-resistive (GMR) junctions may be used.

The present invention is not even limited to MRAM devices including resistive cross point arrays. It may be applied to any memory device including magnetic memory elements that need to have their magnetic orientations fixed in certain directions.

The present invention is not limited to the specific embodiments described and illustrated above. Instead, the present invention is construed according to the claims that follow.

What is claimed is:

1. A method comprising:
    forming a magnetic tunnel junction including pinned end sense layers, during which magnetization vectors of the layers are set; and
    later re-setting at least one of the magnetization vectors.

2. The method of claim 1, wherein a magnetization vector is re-set by applying a magnetic field in a direction of interest while annealing the junction.

3. The method of claim 1, wherein the pinned layer magnetization vector is re-set by annealing at a temperature above the blocking temperature of the pinned layer while applying a magnetic field in a direction of interest for the pinned layer.

4. The method of claim 1, wherein the sense layer magnetization angle is re-set by heating the junction above a threshold temperature for easy axis rotation of the sense layer, while applying a magnetic field in a direction of interest for the sense layer.

5. The method of claim 1, further comprising testing the switching characteristics of the junction; and re-setting at least one magnetization vector according to test results.

6. A method comprising:
    forming a magnetic tunnel junction Including pinned end sense layers; and
    re-setting a magnetization vector of at least one of the layers;
    wherein both the sense layer magnetization vector and the pinned layer magnetization vector are re-set by re-annealing.

7. The method of claim 6, wherein the magnetization vectors are re-set to improve switching curve symmetry.

8. The method of claim 6, wherein the magnetization vectors are re-set to reduce critical switching field.

9. The method of claim 6, wherein the magnetization vectors are re-set to point in the same direction.

10. A method comprising:
    forming a magnetic tunnel junction including pinned and sense layers; and
    re-setting a magnetization vector of at least one of the layers;
    wherein the pinned layer magnetization vector is re-set to compensate for strong ferromagnetic coupling and weak antiferromagnetic coupling.

11. The method of claim 10, wherein the pinned layer magnetization vector is moved away from the sense layer magnetization vector.

12. The method of claim 10, wherein the pinned layer magnetization vector is re-set to improve switching curve symmetry.

13. The method of claim 10, wherein the pinned layer magnetization vector is re-set to reduce critical switching field.

14. A method comprising:
   forming a magnetic tunnel junction including pinned and sense layers; and
   re-setting a magnetization vector of at least one of the layers;
   wherein sense layer magnetization angle is changed independently of pinned layer magnetization angle.

15. A method comprising:
   forming a magnetic tunnel junction including pinned and sense layers;
   determining a desired switching curve for the junction; and
   re-setting a magnetization vector of at least one of the layers.

16. The method of claim 15, wherein both the sense layer magnetization vector and the pinned layer magnetization vector are re-set by re-annealing.

17. The method of claim 16, wherein the magnetization vectors are re-set to improve switching curve symmetry.

18. The method of claim 16, wherein the magnetization vectors are re-set to reduce critical switching field.

19. The method of claim 16, wherein the magnetization vectors are re-set so that easy axes of the pinned and sense layers point in the same direction.

20. The method of claim 15, wherein the pinned layer magnetization vector only is re-set by re-annealing.

21. The method of claim 20, wherein the pinned layer magnetization vector is moved away from the sense layer magnetization vector.

22. The method of claim 20, wherein the pinned layer magnetization vector is re-set to improve switching curve symmetry.

23. The method of claim 20, wherein the pinned layer magnetization vector is re-set to reduce critical switching field.

24. The method of claim 20, wherein sense layer magnetization angle is changed independently of pinned layer magnetization angle.

* * * * *